(12) United States Patent
Schellhammer et al.

(10) Patent No.: US 9,698,329 B2
(45) Date of Patent: *Jul. 4, 2017

(54) SOLID-STATE LIGHT EMITTERS HAVING SUBSTRATES WITH THERMAL AND ELECTRICAL CONDUCTIVITY ENHANCEMENTS AND METHOD OF MANUFACTURE

(71) Applicant: Quora Technology, Inc., Los Gatos, CA (US)

(72) Inventors: Scott D. Schellhammer, Meridian, ID (US); Scott E. Sills, Boise, ID (US); Casey Kurth, Boise, ID (US)

(73) Assignee: Quora Technology, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/824,911

(22) Filed: Aug. 12, 2015

(65) Prior Publication Data

US 2016/0072016 A1    Mar. 10, 2016

Related U.S. Application Data

(63) Continuation of application No. 12/836,970, filed on Jul. 15, 2010, now Pat. No. 9,293,678.

(51) Int. Cl.
| | |
|---|---|
| *H01L 33/64* | (2010.01) |
| *H01L 33/62* | (2010.01) |
| *H01L 33/32* | (2010.01) |
| *H01L 33/46* | (2010.01) |
| *H01L 33/14* | (2010.01) |

(52) U.S. Cl.
CPC ............ *H01L 33/647* (2013.01); *H01L 33/32* (2013.01); *H01L 33/46* (2013.01); *H01L 33/62* (2013.01); *H01L 33/145* (2013.01); *H01L 2224/48091* (2013.01); *H01L 2224/49107* (2013.01); *H01L 2933/0066* (2013.01)

(58) Field of Classification Search
None
See application file for complete search history.

(56) References Cited

U.S. PATENT DOCUMENTS

| 5,137,597 A | 8/1992 | Curry et al. |
| 5,432,808 A | 7/1995 | Hatano et al. |
| 7,256,483 B2 | 8/2007 | Epler et al. |
| 7,329,905 B2 | 2/2008 | Ibbetson et al. |
| 9,293,678 B2 * | 3/2016 | Schellhammer ........ H01L 33/62 |

(Continued)

OTHER PUBLICATIONS

CRC Handbook of Chemistry and Physics, 95th edition, 2014-2015, p. 12-41,"Electrical Resistivity of Pure Metals".

(Continued)

*Primary Examiner* — Johannes P Mondt
(74) *Attorney, Agent, or Firm* — Kilpatrick Townsend & Stockton LLP

(57) ABSTRACT

Solid-state lighting devices (SSLDs) including a carrier substrate with conductors and methods of manufacturing SSLDs. The conductors can provide (a) improved thermal conductivity between a solid-state light emitter (SSLE) and a package substrate and (b) improved electrical conductivity for the SSLE. In one embodiment, the conductors have higher thermal and electrical conductivities than the carrier substrate supporting the SSLE.

17 Claims, 9 Drawing Sheets

(56) References Cited

U.S. PATENT DOCUMENTS

| | | |
|---|---|---|
| 2003/0006418 A1* | 1/2003 | Emerson ............. H01L 21/0237 257/79 |
| 2004/0026708 A1 | 2/2004 | Chen |
| 2004/0188696 A1 | 9/2004 | Hsing Chen et al. |
| 2004/0227149 A1* | 11/2004 | Ibbetson ................. H01L 33/54 257/100 |
| 2005/0006783 A1 | 1/2005 | Takao et al. |
| 2006/0027818 A1 | 2/2006 | Yoo |
| 2006/0275946 A1 | 12/2006 | MacNamara et al. |
| 2006/0278885 A1* | 12/2006 | Tain ........................ H01L 33/62 257/99 |
| 2007/0172973 A1 | 7/2007 | Yoo |
| 2007/0284602 A1 | 12/2007 | Chitnis et al. |
| 2008/0099770 A1* | 5/2008 | Mendendorp ........... H01L 33/64 257/79 |
| 2008/0170396 A1 | 7/2008 | Yuan et al. |
| 2009/0261375 A1 | 10/2009 | Chen et al. |
| 2009/0273002 A1* | 11/2009 | Chiou ................... H01L 33/486 257/99 |
| 2009/0278151 A1 | 11/2009 | Kim |
| 2010/0019222 A1 | 1/2010 | Yan et al. |
| 2010/0051972 A1 | 3/2010 | Chen et al. |
| 2011/0198638 A1 | 8/2011 | Wang et al. |
| 2012/0012855 A1 | 1/2012 | Schellhammer et al. |

OTHER PUBLICATIONS

Nakamura, S., "Present Performance of InGaN based blue/green/yellow LEDs", SPIE vol. 3002, pp. 26-35 (Apr. 1997).

* cited by examiner

SOLID-STATE LIGHT EMITTERS HAVING SUBSTRATES WITH THERMAL AND ELECTRICAL CONDUCTIVITY ENHANCEMENTS AND METHOD OF MANUFACTURE

CROSS-REFERENCE TO RELATED APPLICATION

This application is a continuation of U.S. application Ser. No. 12/836,970 filed Jul. 15, 2010, which is incorporated herein by reference in its entirety.

TECHNICAL FIELD

The present disclosure is related to solid-state lighting devices (SSLDs) and associated methods of operation and manufacture. In particular, the present disclosure is related to solid-state light emitters (SSLEs) and associated methods of packaging.

BACKGROUND

Solid-state lighting devices (SSLDs) use semiconductor light-emitting diodes (LEDs), polymer light-emitting diodes (PLEDs), and organic light-emitting diodes (OLEDs) as sources of illumination. Generally, SSLDs generate less heat, provide greater resistance to shock and vibration, and have longer life spans than conventional lighting devices (e.g., florescent tubes, light bulbs) that use filaments, plasma, or gas as sources of illumination.

A conventional type of SSLD is a "white light" LED. White light requires a mixture of wavelengths to be perceived by human eyes. However, LEDs typically only emit light at one particular wavelength (e.g., blue light), so LEDs must be modified to emulate white light. One conventional technique for doing so includes depositing a converter material (e.g., phosphor) on the LED. For example, as shown in FIG. 1A, a conventional LED device 10 includes a support 2 carrying an LED die 4 and a converter material 6 deposited on the LED die 4. The LED die 4 can include one or more light emitting components. FIG. 1B is a cross-sectional diagram of a portion of a conventional indium-gallium nitride LED 10. As shown in FIG. 1B, the LED die 4 includes a substrate 12, N-type gallium nitride (GaN) material 14, an indium gallium nitride (InGaN) material 16 (and/or GaN multiple quantum wells), and a P-type GaN material 18 on one another in series. Conventional substrates 12 are comprised of sapphire, silicone carbide, or silicon. The LED die 4 can further include a first contact 20 on the P-type GaN material 18 and a second contact 22 on the N-type GaN material 14. Referring to both FIGS. 1A and 1B, in operation, the InGaN material 16 of the LED die 4 emits a blue light that stimulates the converter material 6 to emit a light (e.g., a yellow light) at a desired frequency. The combination of the blue and yellow emissions appears white to human eyes if matched appropriately.

Although LEDs produce less heat than conventional lighting devices, one challenge of SSLDs in general is that some of the components are sensitive to heat and the LED die 4 or SSLE produces enough heat to increase the rate that such components deteriorate. The substrate 12 may have a relatively low thermal conductivity such that it traps the heat and raises the temperature of the converter material 6. The converter material 6 deteriorates relatively rapidly at higher temperatures, which causes the converter material 6 to emit light at a different frequency than the desired frequency. As a result, the combined emissions appear off-white and may reduce the color fidelity of electronic devices. A device that provides thermal cooling at the junction between LED die 4 and the substrate 12 would increase the reliability of white light production and maintain the desired color of light for longer periods. Additionally, thermal cooling at the junction would increase the efficiency and the life span of LEDs. Therefore, several improvements in managing the thermal cooling in LED packages, and more generally SSLDs, may be desirable.

DETAILED DESCRIPTION

Specific details of several embodiments of the new technology are described below with reference to solid-state lighting devices (SSLDs) and associated methods of manufacturing SSLD packages. The term "SSLD" generally refers to "solid state light device" and/or "solid state lighting device" according to the context in which it is used. The term "SSL emitter" or "SSLE" generally refers to solid state components that convert electrical energy into electromagnetic radiation in the visible, ultraviolet, infrared and/or other spectra. SSL emitters include "LEDs," which are semiconductor diodes that convert electrical energy into electromagnetic radiation in a desired spectrum. The term "phosphor" generally refers to a material that can continue emitting light after exposure to energy (e.g., electrons and/or photons). Additionally, an LED package and methods of manufacturing LED assemblies are specifically described below to provide an enabling disclosure, but the package and methods can be applied to any SSLD. A person skilled in the relevant art will understand that the new technology may have additional embodiments and that the new technology may be practiced without several of the details of the embodiments described below with reference to FIGS. 2-7D.

Figure 2:
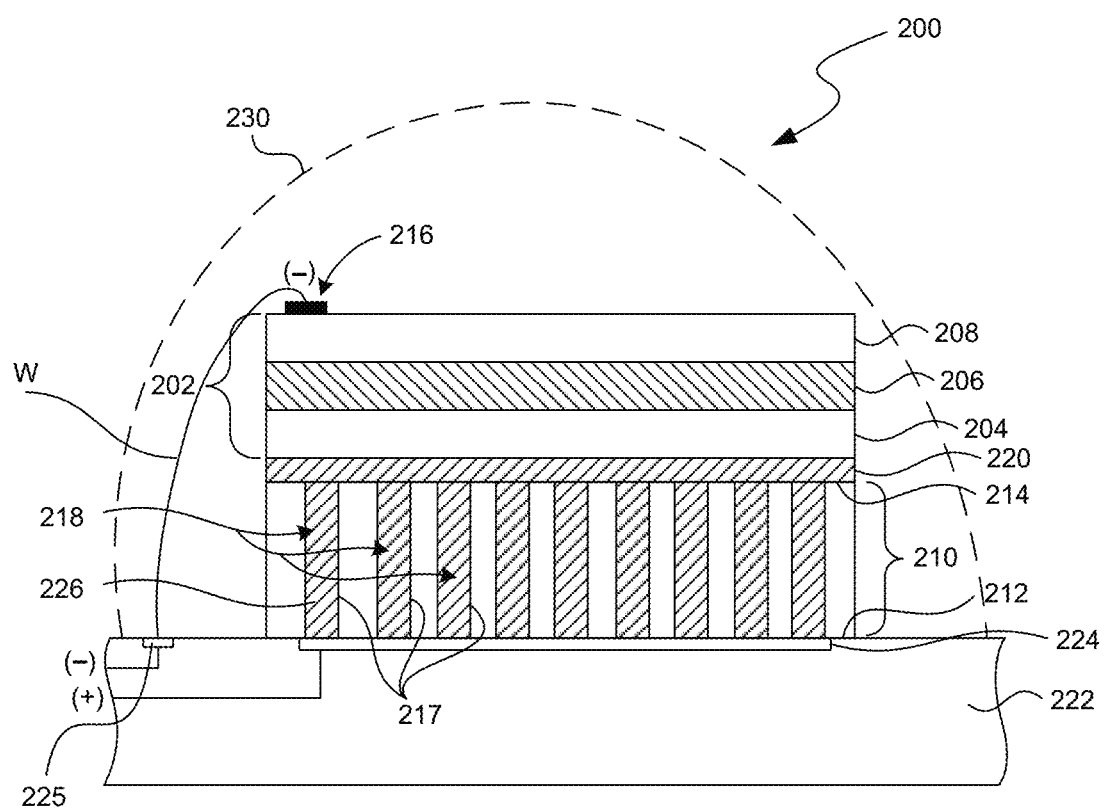
FIG. 2 is a schematic cross-sectional view of a solid-state lighting device (SSLD) in accordance with an embodiment of the new technology.

FIG. 2 illustrates a vertical SSLD 200 in accordance with several embodiments of the new technology. The SSLD 200 includes a carrier substrate 210 having a first surface 212, a second surface 214 opposite the first surface 212, and a plurality of conductors 218. The embodiment of the SSLD 200 shown in FIG. 2 further includes a SSLE 202, a reflective material 220 between the SSLE 202 and the carrier substrate 210, and a package substrate 222. In one embodiment, the reflective material 220 is deposited on a second surface 214 of the carrier substrate 210, and the SSLE 202 is mounted on the reflective material 220. However, in other embodiments the reflective material 220 can be deposited on the SSLE 202, and the SSLE 202 with the reflective material 220 is mounted to the second surface 214 of the carrier substrate 210. The package substrate 222 can have a first contact 224 on which the first surface 212 of the carrier substrate 210 is surface mounted and a second contact 225. Additionally, the SSLD 200 may optionally include a converter material 230 (shown in dashed lines) covering at least the SSLE 202. The converter material 230 is configured to emit radiation that combines with the radiation generated by the SSLE 202 to provide the desired color of light.

The carrier substrate 210 provides both mechanical support for the SSLE 202 and rigidity to the package 200. In FIG. 2, the carrier substrate 210 comprises a material that is non-transmissive to the radiation generated by the SSLE 202, such as silicon (Si), copper (Cu), Aluminum (Al), alloys and/or other suitable non-transmissive materials. As explained in more detail below, the carrier substrate 210 has a plurality of apertures 217 that extend from the first surface 212 to at least an intermediate depth in the carrier substrate 210. In the embodiment shown in FIG. 2, the apertures 217 extend completely through the carrier substrate 210 from the first surface 212 to the second surface 214.

The conductors 218 comprise a conductive material 226 that can have a higher thermal and/or electrical conductivity than that of the carrier substrate 210. For example, the conductive material 226 may comprise copper (Cu), aluminum (Al), tungsten (W), and/or other suitable substances or alloys. The conductors 218 accordingly provide a conductive heat sink that transfers heat away from SSLE 202. When the conductors 218 include a suitably electrically conductive material, they can also provide an electrical connection between the SSLE 202 and the package substrate 222.

The conductors 218 include one or more conductive materials that fill at least a portion of the apertures 217, and the conductors 218 can have a variety of shapes and sizes. The conductors 218 shown in FIG. 2 are through-substrate conductors that completely fill the apertures 217 and extend from the first surface 212 of the carrier substrate 210 to the second surface 214. In the through-substrate configuration, the conductors 218 can provide both thermal cooling and electrical connection to the SSLE 202. Alternatively, the conductors 218 can be blind conductors that extend from the first surface 212 of the carrier substrate 210 to only an intermediate depth within the carrier substrate 210 as explained below with reference to FIGS. 6A-B.

The SSLE 202 can be an LED that includes a P-type gallium nitride (GaN) material 204, an indium gallium nitride (InGaN) material 206 (and/or GaN multiple quantum wells), and an N-type GaN material 208 on one another in series. In the embodiment of the SSLE 202 shown in FIG. 2, the P-type GaN material 204 defines a backside of the SSLE 202 that faces toward the second surface 214 of the carrier substrate 210 and the N-type GaN material 208 defines a front side of the SSLE 202 that faces outwardly. As explained in detail below with reference to FIGS. 3A-3H, the embodiment of the SSLE 202 shown in FIG. 2 can be formed on a sacrificial silicon substrate (not shown in FIG. 2) by forming the N-type GaN material 208 on the sacrificial silicon substrate, forming the InGaN material 206 on the N-type GaN material 208, and the forming the P-type GaN material 204 on the InGaN material 206. The sacrificial substrate is then removed from the SSLE 202, and the SSLE 202 is mounted such that the P-type GaN material 204 faces toward the second surface 214 of the carrier substrate 210. The SSLE 202 can further include a first contact 216 on the N-type GaN material 208 that is electrically coupled (e.g., through a wire bond W) to the second contact 225 of the package substrate 222. The P-type GaN material 204 can be electrically coupled to the first contact 224 of the package substrate 222 through the reflective material 220 and the conductors 218. This vertical connection largely reduces the need for expensive, time-consuming processes required for aligning and connecting very small electrical terminals between conventional LEDs and substrates.

Figure 1A:
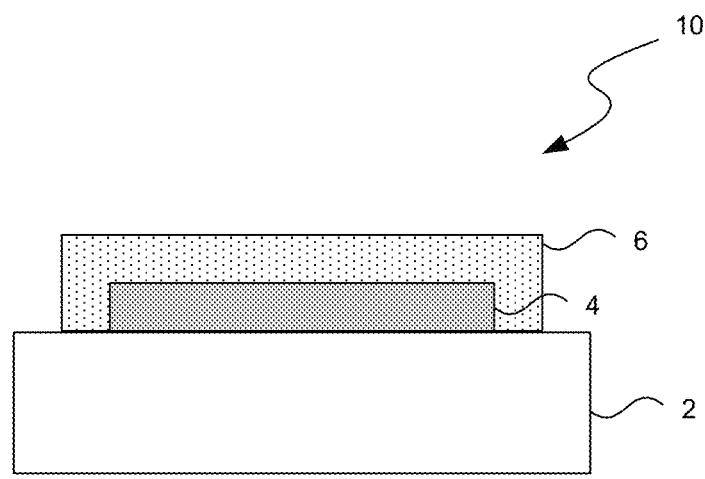
FIG. 1A is a schematic cross-sectional diagram of an LED device in accordance with the prior art.
Figure 1B:
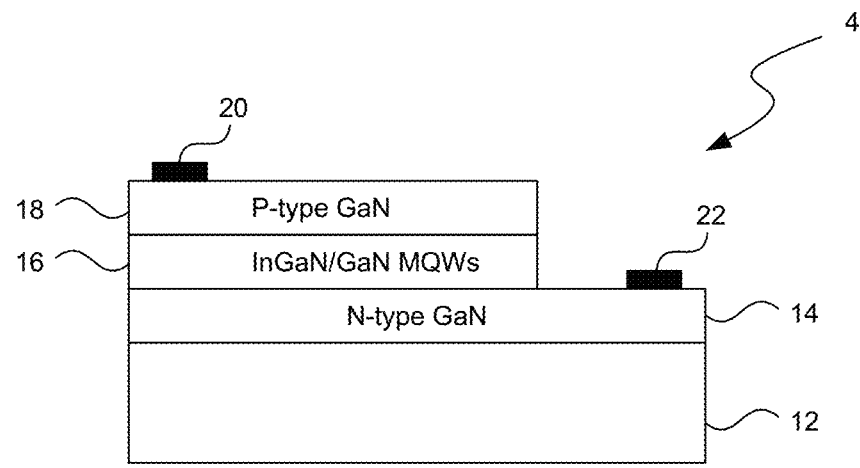
FIG. 1B is a schematic cross-sectional diagram of an LED die in accordance with the prior art.

In other embodiments of the SSLE 202, the P-type GaN material 204 and the N-type GaN material 208 may be reversed so that the N-type GaN material defines the backside of the SSLE 202 that faces toward the second surface 214 of the carrier substrate 210. In another embodiment, the N-type GaN material and the InGaN material may be recessed to expose the P-type GaN material in a similar manner as FIG. 1B. The P-type GaN material can then have a second contact pad that may be electrically coupled (e.g., wirebonded) to the package substrate 222. Alternatively, the P-type GaN material and the N-type GaN material may be reversed so that the P-type GaN material is recessed and the second contact pad is on the N-type GaN material.

The SSLD 200 can include a single SSLE 202, or a plurality of SSLEs 202 can be arranged in an array on the package substrate 222. The SSLE 202 can be configured to emit light in the visible spectrum (e.g., from about 390 nm to about 750 nm), in the infrared spectrum (e.g., from about 1050 nm to about 1550 nm), and/or in other suitable spectra.

The reflective material 220 is configured to reflect radiation initially emitted toward the backside of the SSLE 202 to the front side of the SSLE 202. The reflective material 220 increases the radiation output of the SSLD 200, and decreases the radiation absorbed as heat. The reflective material 220 can comprise silver, gold, aluminum or another material with generally high reflectivity and thermal conductivity. The reflective material 220 can also be chosen based on the color of light each material reflects. For example, a silver material generally does not alter the color of the reflected light. When a colored light is desired, the reflective material 220 can be gold, copper or another colored reflective surface.

To achieve certain colors of light from the SSLE 202, a converter material 230 (e.g., phosphor) can be placed over the SSLE 202 such that light from the SSLE 202 irradiates energized particles (e.g., electrons and/or photons) in the converter material 230; the irradiated phosphor then emits light of a certain quality. Alternatively, the converter material 230 can be spaced apart from the SSLE 202 in any other location that is irradiated by the SSLE 202. In one embodiment, the converter material 230 can include a phosphor containing cerium(III)-doped yttrium aluminum garnet (YAG) at a particular concentration for emitting a range of colors from green to yellow and to red under photoluminescence. In other embodiments, the converter material 230 can include neodymium-doped YAG, neodymium-chromium double-doped YAG, erbium-doped YAG, ytterbium-doped YAG, neodymium-cerium double-doped YAG, holmium-chromium-thulium triple-doped YAG, thulium-doped YAG, chromium(IV)-doped YAG, dysprosium-doped YAG, samarium-doped YAG, terbium-doped YAG, and/or other suitable wavelength conversion materials.

The SSLD 200 is activated by electrically coupling the SSLE 202 to the package substrate 222. In FIG. 2, the N-type GaN material 208 is electrically coupled to the negative potential via the first contact 225 on the package substrate 222, and the P-type GaN 204 is electrically coupled to the positive potential via the second contact 224 on the package substrate 222 and the conductors 218. In operation, the SSLE 202 converts electrical energy into electromagnetic radiation in a desired spectrum, and the reflective material 220 on the second surface 214 of the carrier substrate 210 reflects radiation initially emitted toward the backside of the SSLE 202 to the front side of the SSLE 202. The conductors 218, which may have a higher thermal conductivity than the carrier substrate 210, transfer heat away from the SSLE 202. This reduction in heat reduces deterioration of the converter material 230 and the junction between the P-type and N-type semiconductor materials 204 and 208. Additionally, in FIG. 2, the conductors 218 provide improved electrical conductivity between the P-type GaN material 204 and the package substrate 222. Therefore, the performance efficiency of the SSLD 200 is increased because the carrier substrate 210 aids in both the electrical and thermal conductivity between the SSLE 202 and the package substrate 222, which, as is illustrated in FIG. 2, can be in direct contact with the carrier substrate 210.

Figure 3A:
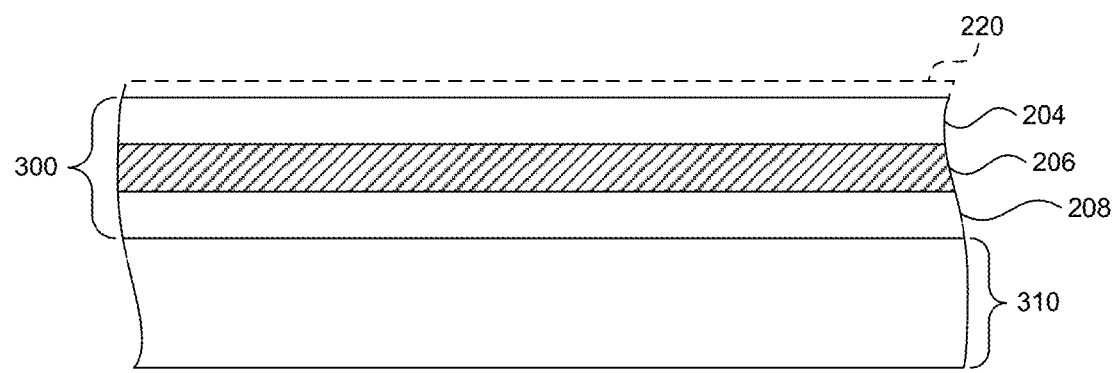
FIGS. 3A-3H are partially schematic cross-sectional views of a process for manufacturing a SSLD in accordance with an embodiment of the new technology.
Figure 3B:
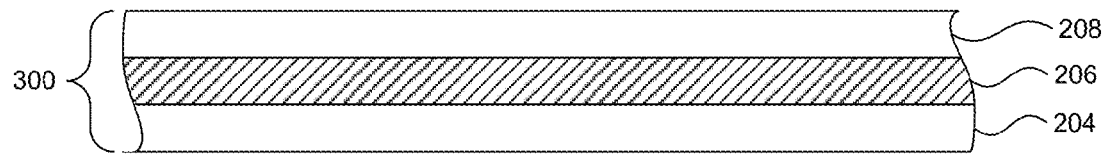

FIGS. 3A-3H are partial schematic cross-sectional views that illustrate sequential stages in a process for manufacturing several SSLDs in accordance with several embodiments of the present technology. FIGS. 3A and 3B, more specifically, depict forming an SSLE structure 300 that can be cut at a later stage to form a plurality of individual SSLEs 202. Referring to FIG. 3A, the SSLE structure 300 is constructed by forming the N-type GaN material 208 on a sacrificial substrate 310, forming the InGaN material 206 on the N-type GaN material 208, and forming the P-type GaN material 204 on the InGaN material 206. The sacrificial substrate 310 can be silicon, gallium arsenide or any material that allows the SSLE structure 300 to be formed. In the case of a silicon sacrificial substrate 310, N-type GaN material 208 may be formed directly on the silicon or on a buffer having an aluminum nitride (AlN) material formed on the silicon and an aluminum gallium nitride (AlGaN) material formed on the AlN material. After the SSLE structure 300 is formed on the sacrificial substrate 310, the reflective material 220 may optionally be deposited on the P-type GaN material 204 (shown in dashed lines).

FIG. 3B shows the next sequential step of manufacturing the SSLE structure 300 in accordance with several embodiments of the present technology. In this step, the sacrificial substrate 310 is removed from the SSLE structure 300 using backgrinding or any other suitable method.

Figure 3C:
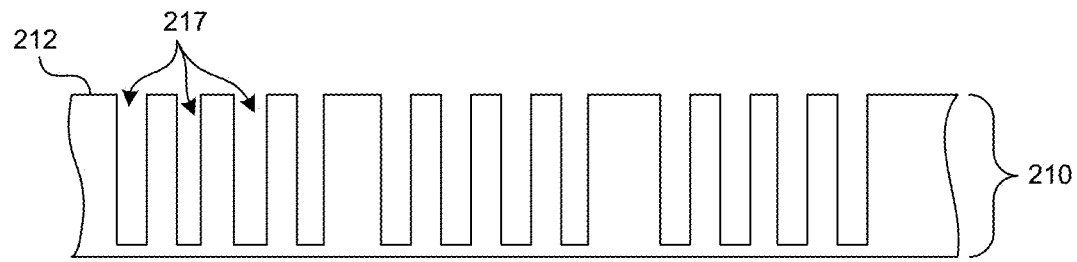

FIGS. 3C-3G illustrate stages of manufacturing the carrier substrate 210. FIG. 3C depicts the carrier substrate 210 after the apertures 217 have been formed. The apertures 217 can be formed by photo-patterning the arrangement of the apertures 217 in a resist layer (not shown) on the carrier substrate 210, and subsequently etching the apertures 217 into the carrier substrate 210. The apertures 217 can alternatively be formed using laser drilling or other suitable techniques. The apertures 210 may be any shape and size suitable for thermal and/or electrical conductivity. At this stage of the process, as shown in FIG. 3C, the apertures 217 may be blind holes that extend from the first surface 212 of the carrier substrate 210 to a desired intermediate depth within the carrier substrate 210. For example, the apertures 217 may be approximately 80 μm to 100 μm in length. However, the apertures 217 may be longer or shorter. Additionally, the apertures 217 may include elongated trenches, vias, holes, or other suitable types of openings.

Figure 3D:
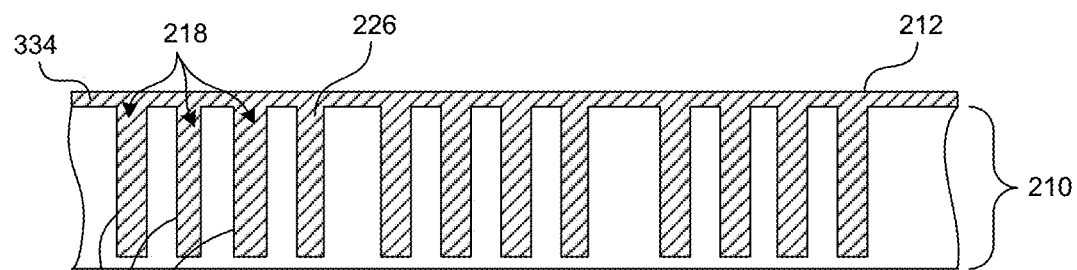

FIG. 3D illustrates a subsequent step in the manufacturing process according to several embodiments of the present technology in which the plurality of apertures 217 are filled with a conductive material 226 to form the conductors 218. The apertures 217 may be filled using plating, physical vapor deposition (PVD), chemical vapor deposition (CVD), or other suitable techniques known in the art. Excess material may be deposited above the apertures 217 and onto the first surface 212 of the carrier substrate 210 to create an overburden 334. In an alternate embodiment, the conductive material 226 may not completely fill the apertures 217, and the carrier substrate 210 can be planarized to form the first surface 212. The conductive material 226 can have a higher thermal conductivity than the carrier substrate 210 to provide a conductive thermal path for cooling the subsequently-attached SSLE 202. Additionally, the conductive material 226 may have high electrical conductivity to provide an electrical connection between the subsequently attached SSLE 202 and the package substrate 222 (FIG. 2).

Figure 3E:
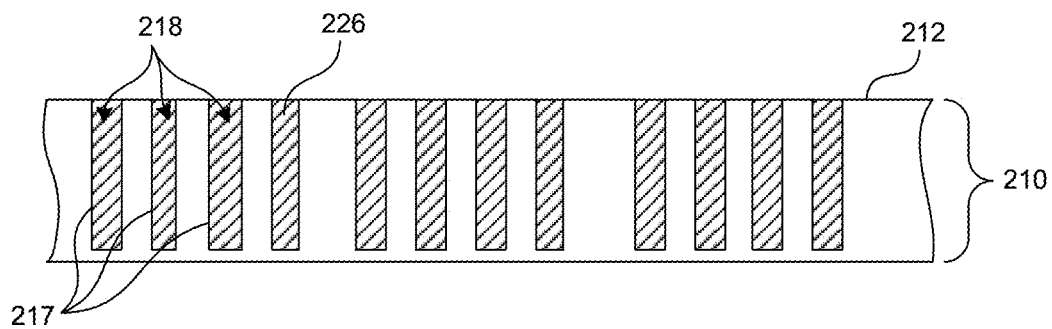
Figure 3F:
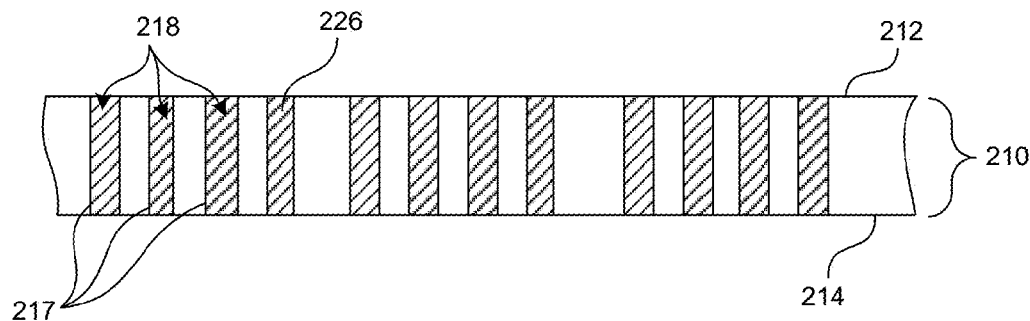

FIGS. 3E and 3F depict additional steps in the manufacturing process according to several embodiments of the present technology. In FIG. 3E, the overburden 334 (shown in FIG. 3D), if any, is removed so that the first surface 212 of the carrier substrate 210 is exposed. The overburden 334 can be removed using any suitable method including chemical-mechanical planarization (CMP), backgrinding, etching, or another method. FIG. 3F illustrates the carrier substrate 210 after thinning the carrier substrate 210 by removing a portion of material from the opposite side of the carrier substrate 210 to form the second surface 214 of the carrier substrate 210. The carrier substrate 210 may be thinned either before or after the SSLE 202 is attached to the carrier substrate 210. The carrier substrate 210 may be thinned by backgrinding, etching, or using any other suitable technique known in the art. As shown in FIG. 3F, the carrier substrate 210 may be thinned to approximately 80 μm to 100 μm so that the apertures 217 extend from the first surface 212 of the carrier substrate 210 to the newly formed second surface 214 of the carrier substrate 210. Alternatively, more or less substrate material may be removed.

Figure 3G:
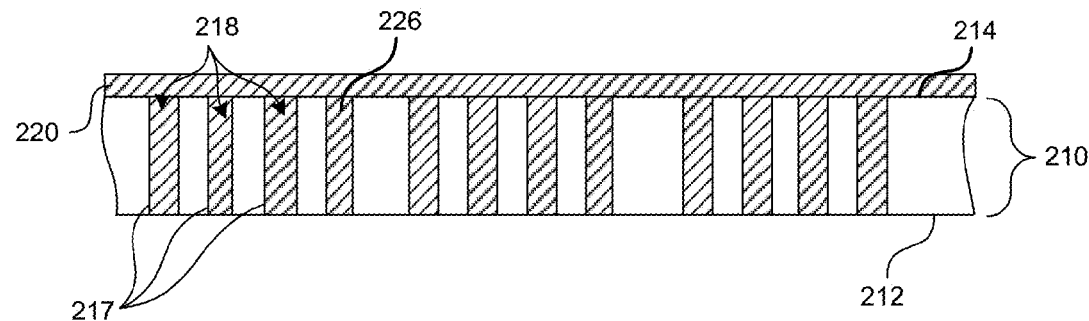

FIG. 3G illustrates a subsequent step of manufacturing the carrier substrate 210 in which the reflective material 220 is deposited onto one of the first surface 212 (not shown) or the second surface 214 (shown in FIG. 3G) of the carrier substrate 210. The reflective material 220 in FIG. 3G is deposited using plating, PVD, CVD, or other suitable techniques known in the art on the second surface 214 of the carrier substrate 210 when the carrier substrate 210 comprises silicon or another material that is non-transmissive to radiation emitted by the SSLE 302. Alternatively, the reflective material 220 can be deposited onto the back side of the SSLE 202 before it is attached to the carrier substrate 210 as noted above in FIG. 3A. When the carrier substrate 210 comprises sapphire, glass or another material that is transmissive to radiation emitted by the SSLE 302, the reflective material may be deposited on the first surface (e.g., bottom) of the substrate because the radiation produced by the SSLE can travel through such transmissive substrates and be reflected back by the reflective material.

Figure 3H:
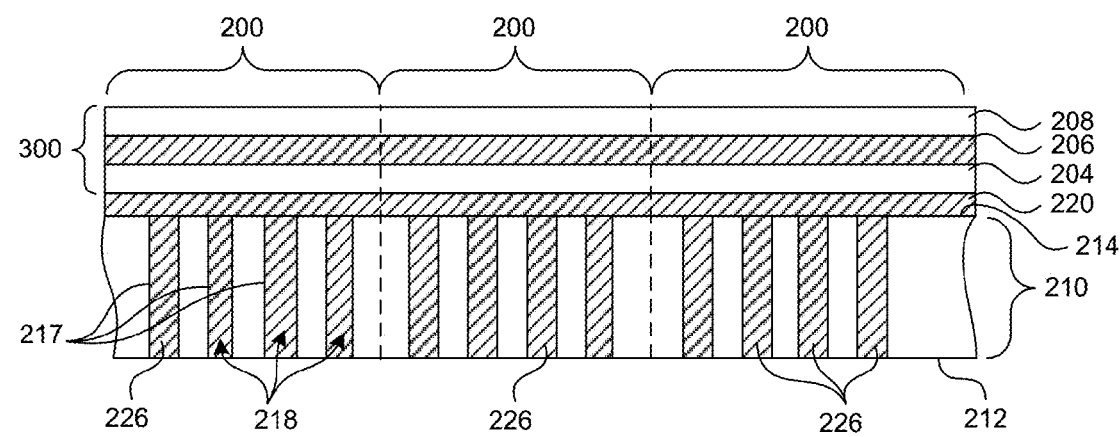

FIG. 3H shows a subsequent step of the manufacturing process according to several embodiments of the present technology in which the SSLE structure 300 is mounted onto the non-transmissive carrier substrate 210. The carrier substrate 210, the reflective material 220, and the SSLE structure 300 can be singulated to form individual vertical SSLDs 200. Each vertical SSLD 200 may then be mounted onto a package substrate 222 (FIG. 2) and electrically coupled to the package substrate using any suitable method (e.g., surface mounting and/or wirebonding). Alternatively, the non-singulated assembly of the SSLE structure 300 and the sacrificial substrate 210 can be mounted onto a package substrate and subsequently singulated to form individual SSLD packages. In an alternative embodiment, the SSLE structure 300 and carrier substrate 310 are mounted to a package substrate without being singulated to form a larger SSLD package. FIG. 3H shows three individual SSLDs 200, but it should be noted that more or less SSLDs may be manufactured at the same time.

Figure 4A:
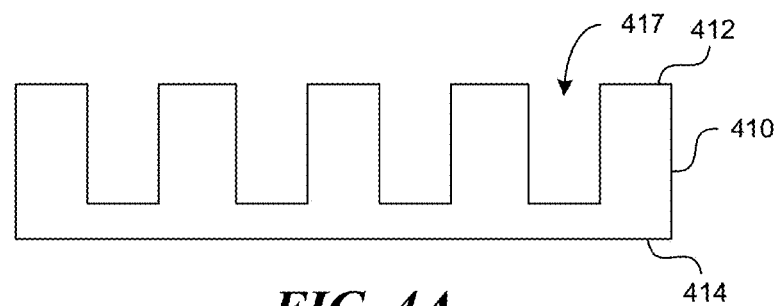
FIGS. 4A-4D are schematic cross-sectional views of a process for manufacturing conductors for SSLDs in accordance with an embodiment of the new technology.

FIGS. 4A-4D illustrate processes for manufacturing a carrier substrate having conductors in accordance with several embodiments of the present technology. For example, FIG. 4A shows a side cross-sectional view of a portion of a carrier substrate 410 after formation of a plurality of apertures 417 in accordance with an embodiment of the invention. The apertures 417 can be formed using any of a variety of techniques, including etching, laser removal, and other suitable methods as described above with reference to FIG. 3C. As shown in FIG. 4A, the apertures 417 can be blind apertures that extend to an intermediate depth within the carrier substrate 410 between a first surface 412 and a second surface 414.

Figure 4B:
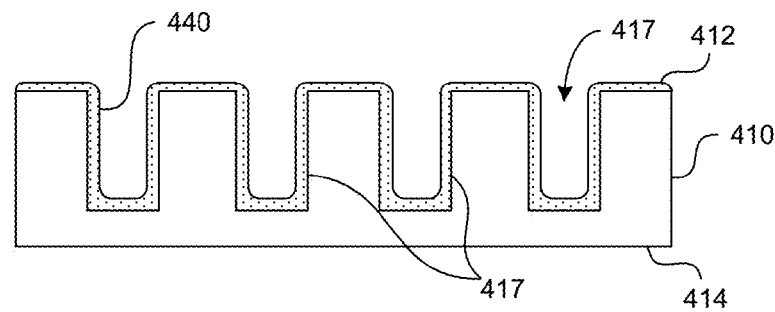
Figure 4C:
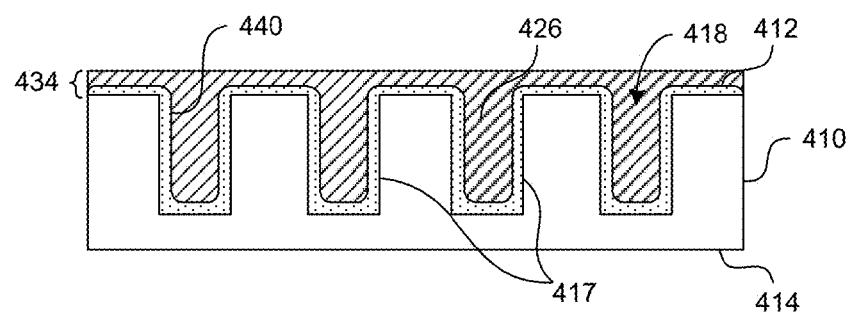

FIG. 4B shows a stage of the process in which a diffusion barrier 440 is deposited onto the carrier substrate 410 to line sidewalls of the apertures 417, and FIG. 4C shows a subsequent stage in which a fill material 426 has been deposited into the apertures 417. The diffusion barrier 440 prevents diffusion of the fill material 426 into the material of the carrier substrate 410, and the diffusion barrier 440 may also enhance the adhesion of the fill material 426 to the carrier substrate 410. In one embodiment, for example, the diffusion barrier 440 is a layer of tantalum that is deposited onto the carrier substrate 410 using a physical vapor deposition (PVD) process. The thickness of the diffusion barrier 440 can be about 150 Angstroms. In other embodiments, the diffusion barrier 440 may be deposited onto the carrier substrate 410 using other processes, such as chemical vapor deposition (CVD), and/or may have a different thickness. The composition of the diffusion barrier 440 is not limited to tantalum, but rather may be comprised of tungsten, tantalum nitride, or other suitable materials.

Referring to FIG. 4C, the fill material 426 can be deposited into the apertures 417 to form conductors 418 and an overburden 434 portion that covers the first surface 412 of the carrier substrate 410. The fill material 426 comprises materials that have a higher thermal conductivity than the carrier substrate 410 to create a conductive heat transfer path between an SSLE and a packaging substrate. The conductive material can accordingly be defined by the combination of the diffusion barrier 440 and the fill material 426. Additionally, the fill material 426 can include solder or an electrically conductive polymer in one embodiment and/or other constituents in other embodiments. In particular embodiments, the fill material 426 can be less conductive than the diffusion barrier 440. For example, in some embodiments, the fill material 426 need not be electrically conductive at all if other constituents in the apertures 417 are sufficiently thermally and/or electrically conductive. Accordingly, in any of these embodiments, one or more of the fill material 426 and the diffusion barrier 440 form the thermally and/or electrically conductors. In alternative embodiments, additional layers of material may be deposited in the apertures 417. For example, a seed layer, a conductive lining, or any other suitable layer can also be formed in the apertures 417.

Figure 4D:
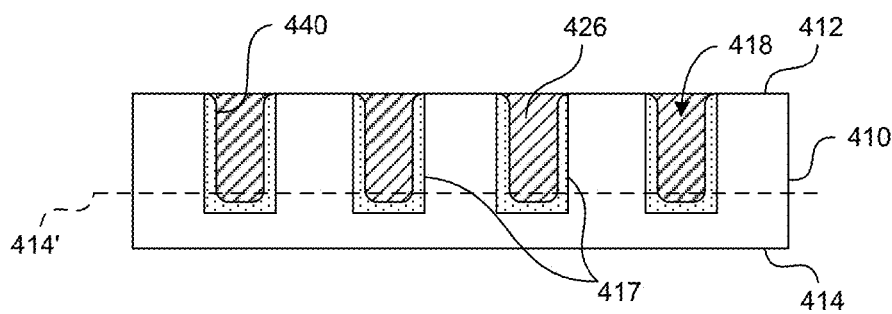

FIG. 4D illustrates a subsequent stage of the process in which the overburden 434 is removed from the carrier substrate 410 to expose the first surface 412. For example, a CMP process can be used to remove only the overburden 434 (FIG. 4C). However, in certain embodiments the overburden 434 is not removed because it can provide additional heat transfer properties to withdraw heat from the backside of an SSLE attached to the carrier substrate 410. Additionally, the carrier substrate 410 can optionally be thinned such that original second surface 414 of the carrier substrate 410 is changed to a final second surface shown by dashed line 414' to expose the conductors 418 at the final second surface 414'.

Figure 5:
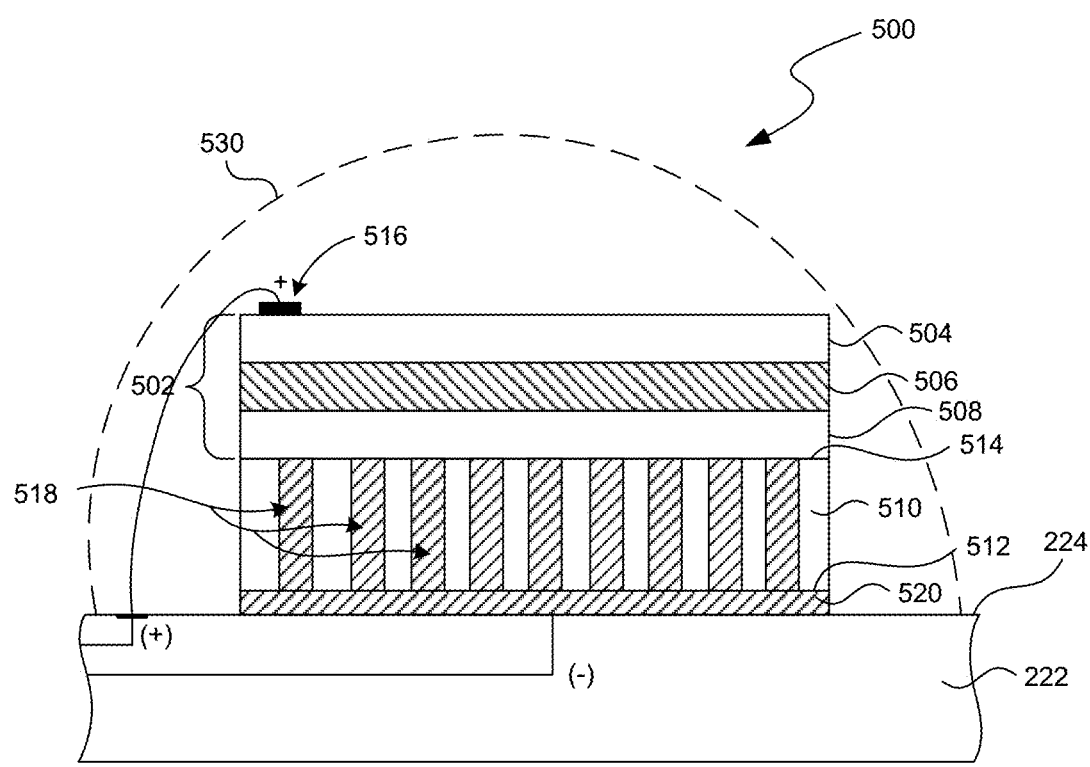
FIG. 5 is a schematic cross-sectional view of a SSLD in accordance with an embodiment of the new technology.

FIG. 5 illustrates an alternate embodiment of an SSLD 500 in accordance with the present technology. Features of the SSLD 500 are generally similar to features of FIG. 2, but the SSLD 500 has a substrate 510 comprising a material that is transmissive to radiation emitted by an SSLE 502. The substrate 510, for example, can comprise sapphire or glass. The substrate 510 can have a plurality of conductors 518 comprising a conductive material, and the substrate 510 can be surface mounted onto the package substrate 222. The SSLD 500 can also have a reflective material 520 on a first surface 512 of the substrate 510 since the radiation from the SSLE 502 can pass through the substrate 510 and reflect from the reflective material 520.

Unlike the carrier substrates 210 and 410, the substrate 510 can be the substrate on which the SSLE structure is formed. For example, an N-type GaN material 508 can be formed on the substrate 510, an InGaN material 506 can then be formed on the N-type GaN material 508, and the P-type GaN material 504 can be formed on the InGaN material 506. The SSLE 502 can also include a first contact pad 516 that electrically couples the P-type GaN material 504 to the package substrate 522. The N-type GaN material 508 is electrically coupled to the package substrate 522 by the conductors 518 and the reflective material 520. The SSLD 500 can further include a converter material 530 (shown in dashed lines) covering the SSLE 502 to alter the radiation produced by the SSLE 502 so that it has the desired characteristics.

In alternative embodiments, the P-type GaN type material and the InGaN material may be recessed to expose the N-type GaN, and the N-type GaN material can then have a second contact pad that may be electrically coupled (e.g., wirebonded) to the package substrate 522. In this embodiment, the conductors in the substrate 510 need not extend entirely through the substrate 510.

Figure 6A:
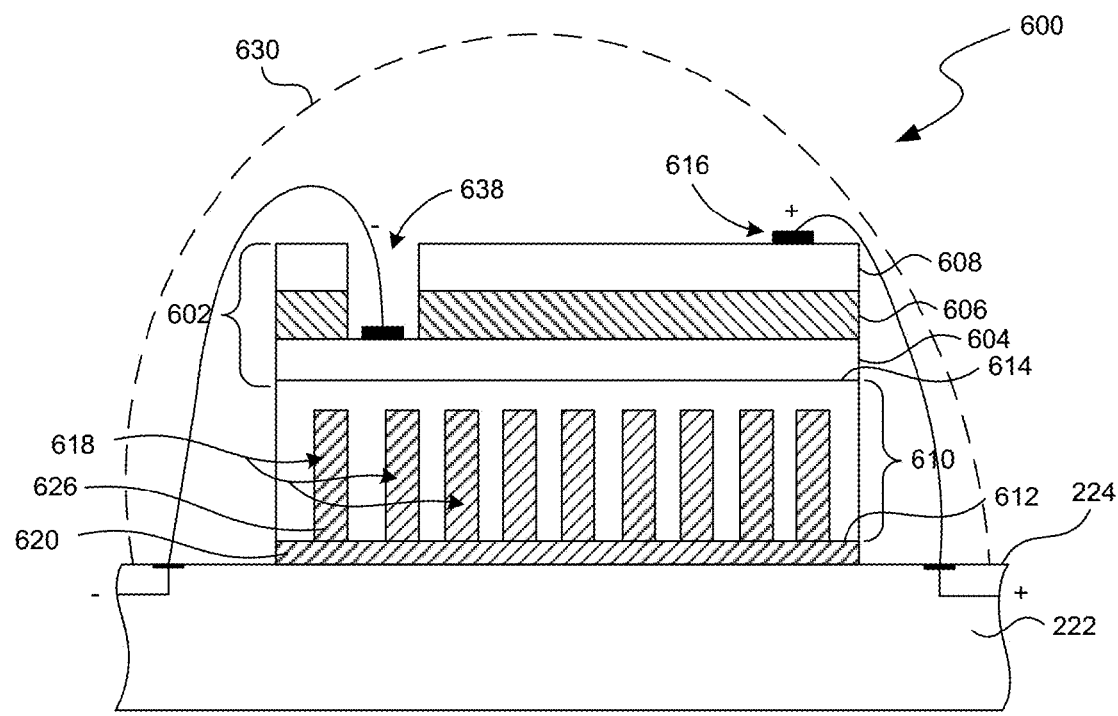
FIGS. 6A and 6B are schematic cross-sectional views of SSLD packages in accordance with embodiments the new technology.
Figure 6B:
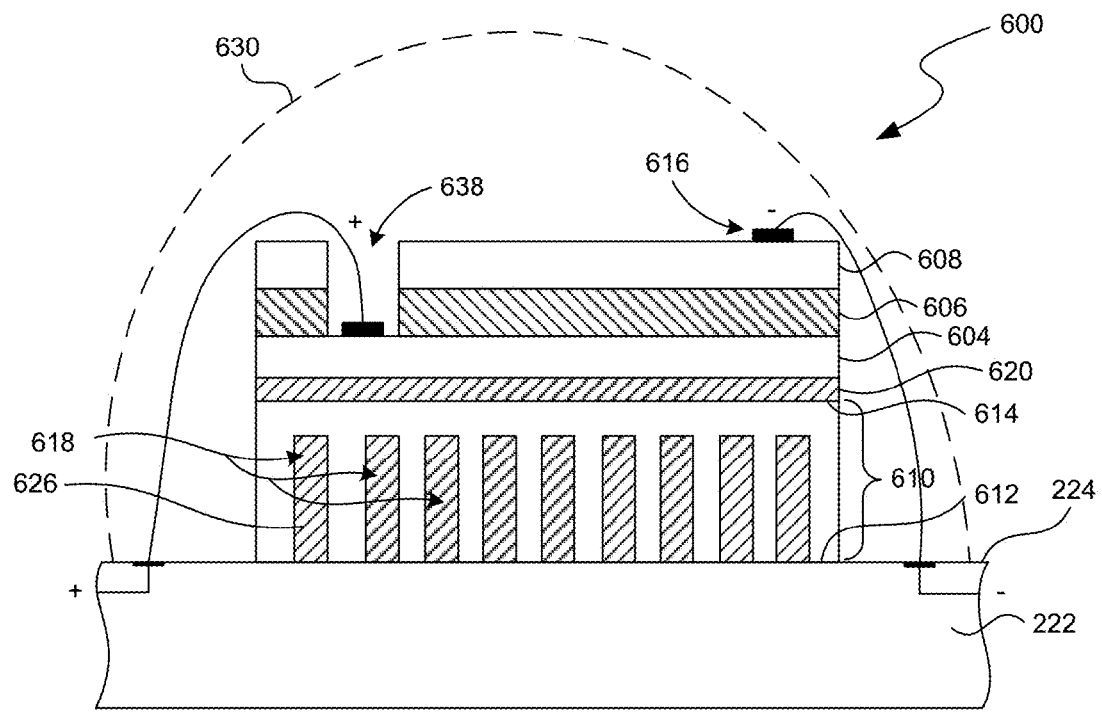

FIGS. 6A and 6B illustrate further embodiments of SSLDs 600 in accordance with the present technology. Features of the SSLDs 600 are generally similar to features of FIG. 2 and FIG. 5, but the SSLDs 600 are transverse or lateral SSLDs (not vertical as described above). A substrate 610 can have conductors 618 comprising conductive material 626, and be mounted onto the package substrate 222. Because the SSLDs 600 have a transverse orientation, the conductors 618 do no extend entirely through the substrate 610, thereby preventing electrical connection with the SSLE 602. The SSLE 602 further includes a first electrical contact 616 and a second electrical contact 638 that electrically couple SSLE 602 to the package substrate 222. The SSLD 600 can further include a converter material 630 (shown in dashed lines) covering the SSLE 602 to alter radiation produced by the SSLE 602 so that it has the desired characteristics.

FIG. 6A illustrates the substrate 610 comprising a material that is transmissive to radiation emitted by the SSLE 602. Therefore, a reflective material 620 can be on the first surface 612 of the substrate 610. In this embodiment, the SSLE 602 can also include a film stack having P-type GaN material 608, an InGaN material 606, and an N-type GaN material 604 from the top down. An aperture extends through the P-type GaN material 608 and the InGaN material 606 to electrically couple (e.g., wirebond) the second contact 638 on the N-type GaN material 604 to the package substrate 222.

FIG. 6B illustrates an alternative embodiment wherein the substrate 610 comprises a material that is non-transmissive to radiation emitted by the SSLE 602. Therefore, a reflective material 620 can be on the second surface 614 of the substrate 610. In this embodiment, the SSLE 602 can include an N-type GaN material 608, an InGaN material 606, and a P-type GaN material 604 from the top down. An aperture extends through the N-type GaN material 608 and the InGaN material 606 to electrically couple (e.g., wirebond) the second contact 638 on the P-type GaN material 604 to the package substrate 222.

Figure 7A:
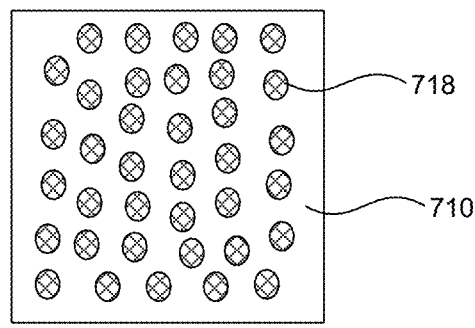
FIGS. 7A-7D are partially schematic top views of conductors for SSLDs in accordance with an embodiment of the new technology.
Figure 7B:
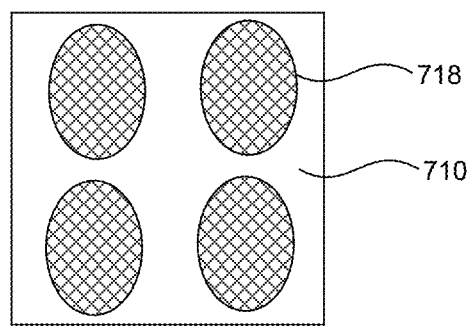
Figure 7C:
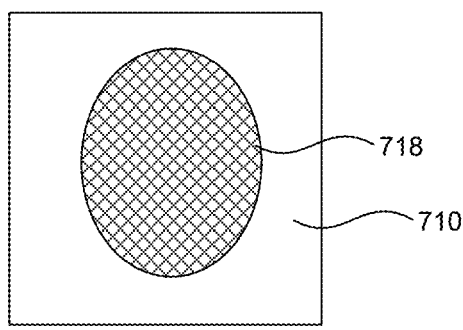
Figure 7D:
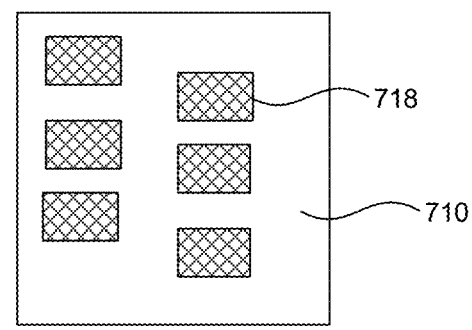

FIGS. 7A-7D illustrate cross-sectional top views of the first surfaces of carrier substrates 710 having different conductor configurations in accordance with an embodiment of the new technology. For example, FIG. 7A depicts conductors 718 that are small columns positioned throughout the carrier substrate 710. In one embodiment, the conductors 718 may be from 10 μm to 500 μm in length and from 20 μm to 100 μm in diameter. In alternative embodiments, the conductors 718 may be larger or smaller and may have different shapes, including, but not limited to squares, rectangles, and stripes. The conductors 718 may be through-substrate or blind hole conductors. FIG. 7B depicts an alternate embodiment of conductors 718 that comprise large diameter pads. The conductors 718 may be any shape, and in one embodiment, may be between 100 μm and 1 mm in diameter. FIG. 7C illustrates an additional embodiment of the carrier substrate 710 configured to have a single, large pad-like conductor 718. The conductor 718 shown in FIG. 7C can have any shape and extend completely through the substrate or only partially through the substrate. Still a further embodiment illustrated in FIG. 7D has conductors 718 in the form of elongated trenches. The trenches may be any shape and size, and/or extend entirely or only partially through the substrate 710, and oriented in the longitudinal and/or transverse directions. For the above embodiments, the conductors 718 may have an aspect ratio of 5:1 or may have smaller or larger aspect ratios.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:
1. A solid-state lighting device (SSLD) comprising:
an active solid-state light emitter (SSLE), the SSLE having a front side and a back side opposite the front side, wherein the SSLE comprises an N-type GaN material, an InGaN material, and a P-type GaN material stacked on each other;
a carrier substrate having a first outer surface, a second outer surface opposite the first outer surface, and at least one aperture extending from the first outer surface to the second outer surface of the carrier substrate, wherein the second outer surface of the carrier substrate faces toward the back side of the SSLE;
a conductor in the at least one aperture, wherein one end of the conductor terminates at the first outer surface of the carrier substrate and another end of the conductor terminates at the second outer surface of the carrier substrate, and wherein the conductor electrically couples one of the N-type GaN material or the P-type GaN material to a first electrical contact at the first outer surface of the carrier substrate; and
a package substrate directly contacting the first outer surface of the carrier substrate, wherein the package substrate carries the first electrical contact and a second electrical contact for the SSLE.

2. The SSLD of claim 1, further comprising a reflective material on the second outer surface of the carrier substrate, wherein the reflective material is configured to reflect radiation emitted by the SSLE.

3. The SSLD of claim 2 wherein the carrier substrate comprises silicon, and wherein the reflective material comprises at least one of copper, silver, aluminum and gold.

4. The SSLD of claim 1 wherein the conductor comprises a material having a higher electrical conductivity and a higher thermal conductivity than the carrier substrate.

5. The SSLD of claim 1 wherein both the conductor and the carrier substrate electrically couple one of the N-type GaN material or the P-type GaN material to the second electrical contact of the package substrate.

6. The SSLD of claim 1 wherein the SSLE is surface mounted to the carrier substrate with the P-type GaN material electrically coupled to the second outer surface of the carrier substrate.

7. The SSLD of claim 1 wherein the SSLE is surface mounted to the carrier substrate with the N-type GaN material electrically coupled to the second outer surface of the carrier substrate.

8. The SSLD of claim 1, further comprising a wirebond coupling the SSLE to the second electrical contact of the package substrate.

9. The SSLD of claim 1 wherein the at least one aperture is a plurality of apertures having sidewalls, and wherein the conductor further comprises:
a diffusion barrier substantially conforming to the sidewalls of the apertures; and
a conductive material at least partially filling the apertures, the conductive material having a higher thermal conductivity and a higher electrical conductivity than the carrier substrate.

10. The SSLD of claim 9 wherein the apertures comprise a plurality of elongated trenches and the conductive material at least partially fills the trenches.

11. The SSLD of claim 9 wherein the apertures are holes and the conductive material at least substantially fills the holes.

12. The SSLD of claim 1, further comprising a converter material covering at least a portion of the SSLE, wherein the converter material and SSLE are configured to emit white light.

13. A solid-state lighting device (SSLD) comprising:
a carrier substrate having a first outer surface and a second outer surface opposite the first outer surface, wherein the carrier substrate comprises an electrically conductive material;
a solid state light emitter (SSLE) comprising an N-type GaN material, an InGaN material over the N-type GaN material, and a P-type GaN material over the InGaN material, wherein the SSLE is mounted to the second outer surface of the carrier substrate;

a conductor extending through at least one aperture of the carrier substrate, the conductor comprising a conductive material having a higher electrical conductivity and a higher thermal conductivity than the carrier substrate, wherein both the carrier substrate and the conductor electrically couple either the N-type GaN material or the P-type GaN material to a first electrical contact at the first outer surface of the carrier substrate;

a continuous reflective material on one of the first and second outer surfaces of the carrier substrate, wherein the reflective material is configured to reflect radiation emitted by the SSLE, and wherein one end of the conductor terminates at the first outer surface of the carrier substrate and another end of the conductor terminates at the second outer surface of the carrier substrate; and a package substrate directly contacting the first outer surface of the carrier substrate, wherein the package substrate carries the first electrical contact and a second electrical contact for the SSLE.

14. The SSLD of claim 13 wherein the continuous reflective material extends across the entire SSLE.

15. The SSLD of claim 13 wherein the at least one aperture is a plurality of apertures having sidewalls, and wherein the conductor further comprises:

a diffusion barrier substantially conforming to the sidewalls of the apertures; and a conductive material at least partially filling the apertures, the conductive material having a higher thermal conductivity and a higher electrical conductivity than the carrier substrate.

16. The SSLD of claim 13 wherein the P-type GaN material is surface mounted to the second outer surface of the carrier substrate, the N-type GaN material includes a first contact pad, and the conductor extends completely through the carrier substrate, and wherein the SSLD further comprises:

a wirebond electrically coupling the first contact pad to the package substrate.

17. The SSLD of claim 13 wherein the conductor further comprises a diffusion barrier.

* * * * *